(12) United States Patent
Kwag et al.

(10) Patent No.: US 11,004,705 B2
(45) Date of Patent: May 11, 2021

(54) CHIP TRANSFER DEVICE AND CHIP TRANSFERRING METHOD USING THE SAME

(71) Applicant: SAMSUNG ELECTRONICS CO., LTD., Suwon-si (KR)

(72) Inventors: Doyoung Kwag, Suwon-si (KR);
Sangmoo Park, Suwon-si (KR);
Yoonsuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/282,581

(22) Filed: Feb. 22, 2019

(65) Prior Publication Data
US 2019/0304816 A1 Oct. 3, 2019

(30) Foreign Application Priority Data
Mar. 29, 2018 (KR) ........................ 10-2018-0036333

(51) Int. Cl.
*H01L 25/075* (2006.01)
*H01L 21/67* (2006.01)
*H01L 21/687* (2006.01)
*H01L 33/62* (2010.01)

(52) U.S. Cl.
CPC .. *H01L 21/67144* (2013.01); *H01L 21/68771* (2013.01); *H01L 21/68778* (2013.01); *H01L 25/0753* (2013.01); *H01L 33/62* (2013.01); *H01L 21/67259* (2013.01); *H01L 21/67288* (2013.01); *H01L 2933/0066* (2013.01)

(58) Field of Classification Search
CPC ................ H01L 25/0753; H01L 33/62; H01L 2933/0066; H01L 21/67144; H01L 21/68771; H01L 21/68778; H01L 21/67259; H01L 21/67288
See application file for complete search history.

(56) References Cited

U.S. PATENT DOCUMENTS 8,646,505 B2   2/2014 Bibl et al.
2010/0172734 A1 7/2010 Cheng et al.
(Continued)

FOREIGN PATENT DOCUMENTS

JP   2006-324395   11/2006
KR   10-0580816    5/2006
KR   10-0920214    9/2009
(Continued)

OTHER PUBLICATIONS

International Search Report and Written Opinion dated Jun. 10, 2019, issued in International Application No. PCT/KR2019/002105.

*Primary Examiner* — Timor Karimy
(74) *Attorney, Agent, or Firm* — Nixon & Vanderhye P.C.

(57) ABSTRACT

A chip transfer device is provided. The chip transfer device according to an embodiment includes a support, a plurality of pick-up modules disposed on the support in a horizontal direction, and movably connected to the support, and a controller configured to control the plurality of pick-up modules, wherein each of the plurality of pick-up modules is movable while collectively picking up a plurality of chips on a corresponding wafer among a plurality of wafers, and wherein the controller moves and adjusts the plurality of pick-up modules in a horizontal direction.

14 Claims, 21 Drawing Sheets

(56) References Cited

U.S. PATENT DOCUMENTS

2012/0210554 A1* 8/2012 Han ....................... H01L 24/75
                                                                                         29/428
2012/0260752 A1 10/2012 Yang et al.

FOREIGN PATENT DOCUMENTS

| KR | 10-2011-0064796 | 6/2011 |
|----|-----------------|--------|
| KR | 10-1511402 | 4/2015 |
| KR | 10-2017-0121909 | 11/2017 |

* cited by examiner

CHIP TRANSFER DEVICE AND CHIP TRANSFERRING METHOD USING THE SAME

CROSS-REFERENCE TO RELATED APPLICATIONS

This application is based on and claims priority under 35 U.S.C. § 119 to Korean Patent Application No. 10-2018-0036333, filed on Mar. 29, 2018, in the Korean Intellectual Property Office, the disclosure of which is incorporated by reference herein in its entirety.

BACKGROUND

1. Field

The disclosure relates to a chip transfer device with improved chip transfer efficiency and a chip transfer method using the same.

2. Description of Related Art

Semiconductor light emitting diodes (LEDs) are widely used as light sources for various display devices of various electronic products such as TVs, mobile phones, PCs, notebook PCs, and PDAs as well as light sources for lighting devices.

Recently, micro LEDs having a size of 100 µm or less have been developed. Micro LEDs have faster response speed, less power and higher luminance than conventional LEDs to be spotlighted as a next generation light emitting device.

The micro LED may be manufactured in the form of a semiconductor chip on a wafer, and mounted on a printed circuit board, which is a target substrate, at predetermined intervals to form a light emitting module of a display.

However, for a plurality of chips such as a plurality of micro LEDs formed on a wafer, because the plurality of chips are placed at a different interval from a predetermined interval on a printed circuit board, there is a need for a process of adjusting intervals between a plurality of chips in moving the plurality of chips on a wafer to a printed circuit board.

For example, a plurality of chips may be formed on a single wafer, and intervals between adjacent chips on a wafer may be smaller than predetermined intervals between adjacent chips mounted to a printed circuit board. In this case, there is a need for a device or a process of extending intervals between the adjacent chips in collectively picking up the adjacent chips formed on a wafer and mounting the chips on a printed circuit board.

Conventionally, in order to mount a plurality of chips at predetermined intervals on a printed circuit board, instead of using a process of extending intervals between adjacent chips during a transfer, a plurality of chips spaced apart from one another on a single wafer at predetermined intervals is selectively picked up or each of the chips on a single wafer is picked up and mounted on a printed circuit board at a predetermined interval.

However, such a conventional chip transfer process requires a plurality of iterations, and the transfer speed is too slow and there is a risk that an error may occur in an interval between a plurality of chips mounted on a printed circuit board.

SUMMARY

An aspect of the example embodiments relates to providing a chip transfer device capable of collectively picking up a plurality of chips of a plurality of wafers, adjusting intervals between the picked-up chips and mounting the chips on a printed circuit board, and a chip transfer method using the same.

According to an example embodiment, a chip transfer device is provided, the chip transfer device including a support, a plurality of pick-up modules disposed on the support in a horizontal direction, and movably connected to the support, and a controller configured to control the plurality of pick-up modules, wherein each of the plurality of pick-up modules is movable while collectively picking up a plurality of chips on a corresponding wafer among a plurality of wafers, and wherein the controller is configured to move and adjust the plurality of pick-up modules in a horizontal direction to equalize intervals between the plurality of chips picked up by each pick-up module.

Each of the plurality of pick-up modules may include a connection part movably connected to the support in a horizontal direction, a pick-up body connected to one end of the connection part, and a plurality of pick-up heads arranged spaced apart from one another on the pick-up body at a first interval.

A length between an outermost pick-up head, among the plurality of pick-up heads, and a side surface of the pick-up body may be half of the first interval.

The controller may move and adjust each connection part in a horizontal direction to render the side surface of the pick-up body to contact a side surface of an adjacent pick-up body while the plurality of pick-up modules pick up the plurality of chips.

The side surface of the pick-up body may include a tooth portion configured to be engaged with the side surface of the adjacent pick-up body.

The controller may move and adjust the connection part in a horizontal direction to equalize intervals of the plurality of chips picked up by the pick-up module at the first interval.

Each of the plurality of pick-up modules may further include a connection extension part which connects the connection part and the pick-up body, wherein the connection extension part is movably formed in a vertical direction from the connection part.

The controller may collectively move and adjust the connection extension part in a vertical direction.

The controller may sequentially control the plurality of pick-up modules while the plurality of pick-up modules pick up the plurality of chips, respective connection parts of the plurality of pick-up modules may move in a horizontal direction, and each connection extension part may move in a vertical direction.

The device may further include a stage including the plurality of wafers or a printed circuit board on which the plurality of picked up chips are mounted.

The plurality of wafers may be disposed in a grid pattern, wherein the plurality of pick-up modules are arranged in a grid pattern to respectively correspond to the plurality of wafers.

According to an example embodiment, a chip transfer method is provided, the method including loading a plurality of wafers on a stage, picking up a plurality of chips on a corresponding wafer collectively by each of a plurality of pick-up modules, and moving and adjusting the plurality of pick-up modules in a horizontal direction to equalize intervals of the plurality of chips picked up by each pick-up module.

The method may further include unloading the plurality of wafers from the stage, loading a printed circuit board on the stage, and mounting the plurality of chips on the printed circuit board as the plurality of pick-up modules move in a vertical direction while picking up the plurality of chips.

The plurality of pick-up modules may move collectively or sequentially in a horizontal direction while picking up the plurality of chips.

BRIEF DESCRIPTION OF THE DRAWINGS

The above and other aspects, features and advantages of various example embodiments of the present disclosure will be more apparent from the following detailed description, taken in conjunction with the accompanying drawings, in which.

DETAILED DESCRIPTION

In order to fully understand the structure and effects of the disclosure, various example embodiments of the disclosure will be described with reference to the accompanying drawings. The disclosure may, however, be embodied in many different forms and should not be understood as being limited to the embodiments set forth herein. It should be understood, however, that the description of the embodiments is provided to enable the disclosure of the disclosure to be complete. In the accompanying drawings, the elements may be enlarged in size for convenience of explanation and the proportions of the elements can be exaggerated or reduced.

It will be understood that when an element is referred to as being "on" or connected to" another element, it can be directly connected to the other element or intervening elements may also be present. On the other hand, when an element is referred to as being "directly on" or "directly connected to" another element, no intervening elements are present. Meanwhile, other expressions describing relationships between components such as "~ between" and "directly adjacent to ~" may be understood similarly.

The terms such as "first," "second," and so on may be used to describe a variety of elements, but the elements should not be limited by these terms. The terms are used simply to distinguish one element from other elements. The use of such ordinal numbers should not be understood as limiting the meaning of the term. For example, without departing from the scope of the disclosure, the first component may be referred to as a second component, and similarly, the second component may also be referred to as a first component.

The singular expression also includes the plural as long as it does not conflict with the context. In this disclosure, terms such as 'include' and 'have/has' should be understood as designating that there are such characteristics, numbers, operations, elements, components or a combination thereof in the disclosure, not to exclude the existence or possibility of adding one or more of other characteristics, numbers, operations, elements, components or a combination thereof.

Unless otherwise defined, all terms (including technical and scientific terms) used herein have the same meaning as commonly understood by one of ordinary skill in the art to which this disclosure belongs.

FIG. 1, FIG. 2, FIG. 3, FIG. 4, FIG. 5 and FIG. 6 are cross-sectional views illustrating an example chip transfer device 1 and an example chip transfer process according to an embodiment of the disclosure.

Hereinafter, the detailed structure of the chip transfer device 1 will be described with reference to FIG. 1, FIG. 2, FIG. 3, FIG. 4, FIG. 5, and FIG. 6.

Figure 1:
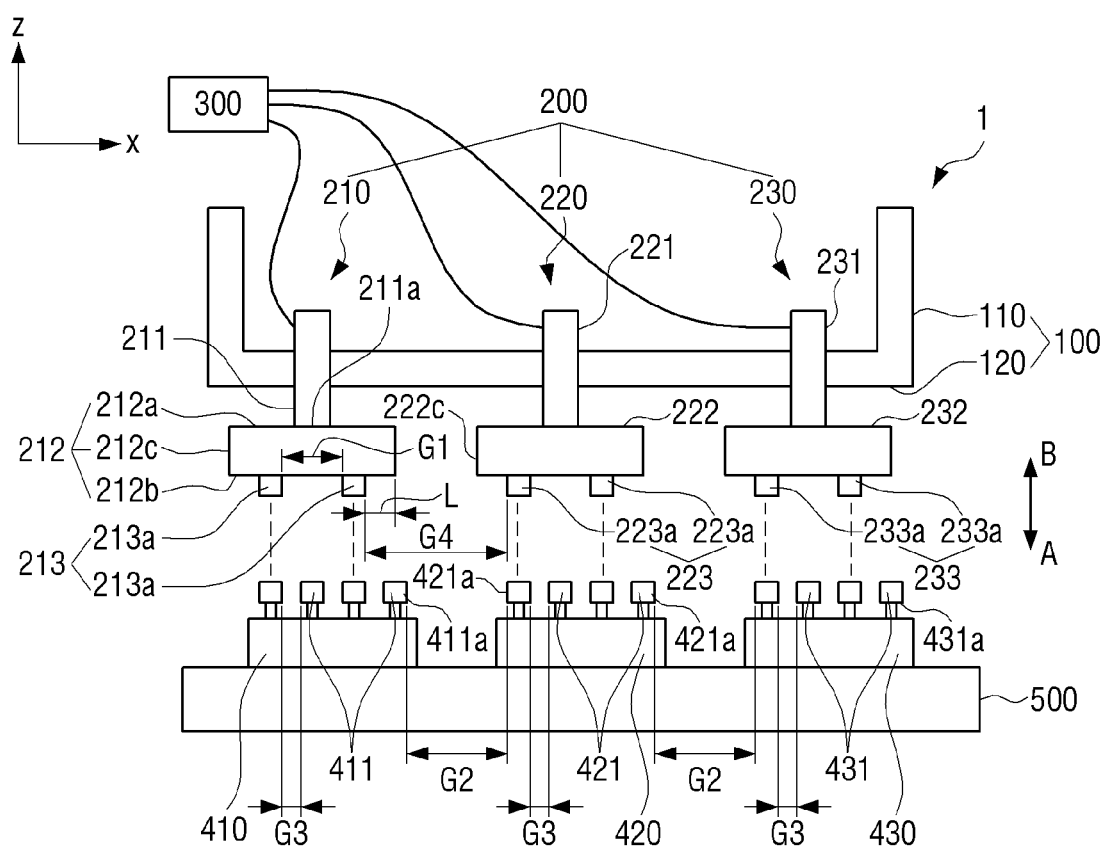
FIG. 1 is a cross-sectional view illustrating an example chip transfer device and an example chip transfer process through a chip transfer device according to an embodiment of the disclosure.

Referring to FIG. 1, the chip transfer device 1 may include a support 100, a pick-up module 200, a controller (e.g., including processing circuitry) 300 and a stage 500.

The support 100 may include a fixing portion 110 and a horizontal portion 120 and support a plurality of pick-up modules 200 (e.g., including pick-up modules 210, 220, 230).

The fixing portion 110 may be engaged with a structural body which is not shown, and move in a horizontal direction (an X-axis direction) and a vertical direction (a Z-axis direction) through a well-known structure such as, for example, and without limitation, a multi-joint structure, a piston structure, a sliding structure, or the like.

The horizontal portion 120 may be coupled to the fixing portion 110, and the fixing portion 110 and the horizontal portion 120 may be integrally formed to the extent necessary. A rail (not shown) may be formed in the horizontal portion 120, and the plurality of pick-up models 200 may move in the horizontal direction (the X-axis direction) along the rail of the horizontal portion 120.

However, to the extent necessary, the horizontal portion 120 may vary as long as the plurality of pick-up modules 200 move in the horizontal direction (the X-axis direction).

The pick-up module 200 may be arranged on the support 100 in a horizontal direction, and movably connected to the support 100.

The pick-up module 200 may include a first pick-up module 210, a second pick-up module 220, and a third pick-up module 230. However, the pick-up module 200 is not limited to a particular number, but it may be plural.

The first pick-up module 210, the second pick-up module 220, and the third pick-up module 230 may be the same configuration, and the first pick-up module 210 will be described as an example for ease of explanation.

The first pick-up module 210 may include a first connector 211, a first pick-up body 212, and a plurality of first pick-up heads 213.

The first connector 211 may connect the support 100 to the first pick-up body 212, and be movably connected to the support 100 in the horizontal direction (the X-axis direction). The first pick-up module 210 may move on the support 100 in the horizontal direction (the X-axis direction) because the first connector 211 is connected to the support 100.

The first pick-up body 212 may, for example, be formed in a cube shape including one surface 212a, the other surface 212b, and a side surface 212c.

The one end 211a of the first connector 211 may be connected to the one surface 212a of the pick-up body 212, and the plurality of first pick-up heads 213 may be arranged on the other surface 212b.

Figure 4:
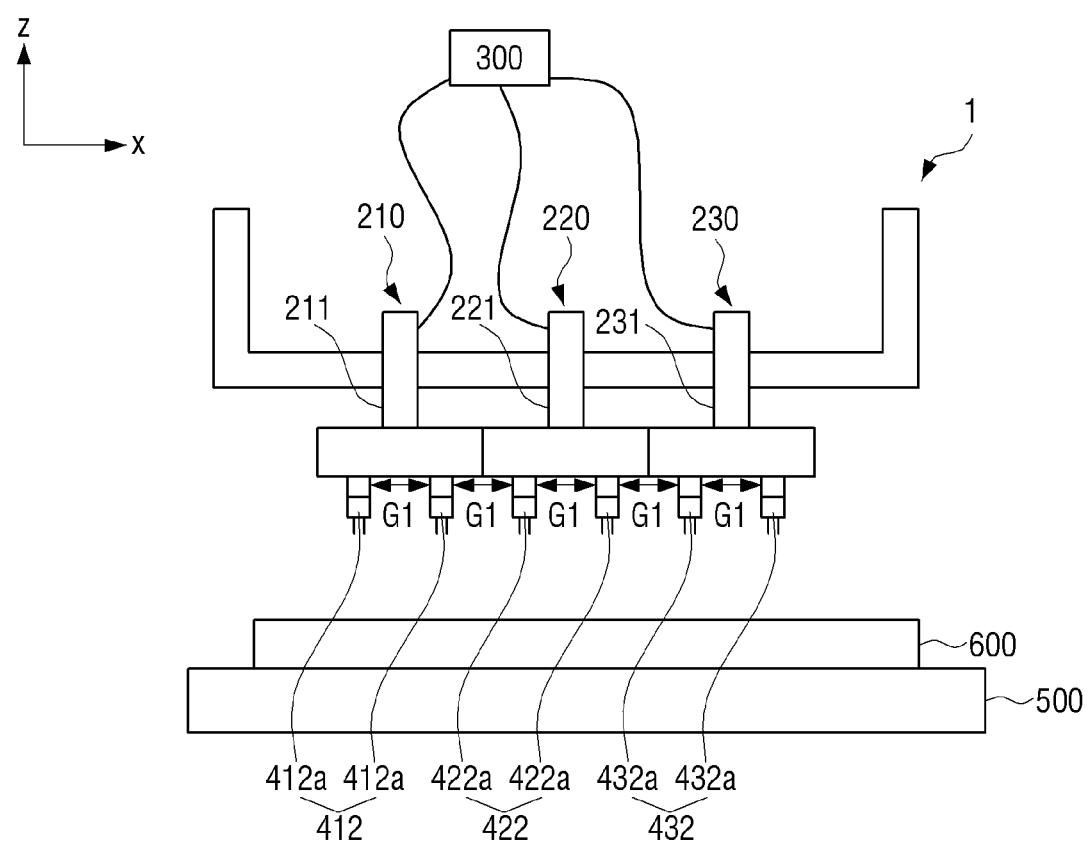
FIG. 4 is a cross-sectional view illustrating an example chip transfer device and an example chip transfer process through a chip transfer device according to an embodiment of the disclosure.

Referring to FIG. 4, the side surface 212c of the first pick-up module 210 may contact the side surface 222c of the second pick-up module 220 adjacent to the first pick-up module 210.

The side surface 212c of the first pick-up body 212 may include a tooth portion 212d (see FIG. 21) to be engaged with the side surface 222c of the second pick-up body 222 adjacent thereto.

In the same manner, the side surface 222c of the second pick-up body 222 may include a tooth portion 222d (see FIG. 21) to be engaged with the side surface 232c of the third pick-up body 232.

Accordingly, the first pick-up module 210 and the second pick-up module 220 may maintain predetermined intervals between chips 412, 422 and 432 picked up by structural contact.

Referring to FIG. 1, the first pick-up head 213 may include a plurality of first pick-up heads, and the first pick-up head 213 may be spaced apart from the first pick-up body 212 at a first interval G1. For example, the plurality of first pick-up head 213 may be arranged on the other surface 212b of the first pick-up body 212 at the first interval G1.

In addition, a length (L) between the pick-up head 213a arranged at the outermost of the plurality of first pick-up head 213 of the first pick-up body 212 and the side surface 212c of the first pick-up body 212 may be half of the first interval G1.

Referring to FIG. 4, while the side surfaces 212c, 222c and 232c of the plurality of the plurality of pick-up modules 210, 220 and 230 contact one another, the intervals between the chips 412, 422 and 432 picked up by the plurality of pick-up heads 213, 223 and 233 may be the first interval G1.

The first pick-up head 213 may pick up a chip 411 on a first wafer 410. The first pick-up head 213 may pick up the chip 411 using various methods such as, for example, and without limitation, an adhesive method, a vacuum method, an electrostatic method, a hybrid method, or the like.

The various methods in which the first pick-up head 213 picks up the chip 411 is well known in the art, and thus the detailed description thereof will not be provided here.

The first connector 211, the first pick-up body 212, and the plurality of first pick-up heads 213 of the first pick-up module 210 have been described, but the configuration of the first pick-up module 210 may be the same as those of the second pick-up module 220 and the third pick-up module 230.

The controller 300 may include various processing circuitry and control the chip transfer device 1 and control (adjust) each of the plurality of pick-up modules 210, 220 and 230 by being electrically and operably connected to the plurality of pick-up modules 210, 220, and 230.

The controller 300 may move the plurality of pick-up modules 210, 220 and 230 in a horizontal direction so that the plurality of chips 412, 422 and 432 picked up by the plurality of pick-up modules 210, 220 and 230 are disposed at the same interval.

The controller 300 may move each of the plurality of connectors 211, 221 and 231 in a horizontal direction so that the plurality of chips 412, 422 and 432 picked up by the plurality of pick-up modules 210, 220 and 230 are disposed at the first interval G1.

Referring to FIG. 1, a plurality of wafers may be disposed on the stage 500, for example, the plurality of wafers may include a first wafer 410, a second wafer 420, and a third wafer 430. However, the wafer is not limited to a particular number, but it may be plural.

The first wafer 410, the second wafer 420, and the third wafer 430 may be the same and the first wafer 410 will be described by way of example for ease of convenience.

The first wafer 410 may, for example, have a circular plate shape, and include a plurality of chips 411, 421 and 431 manufactured in a semi-conductor process. However, the shape of the first wafer 410 may vary to the extent necessary.

The second wafer 420 may be arranged spaced apart from the first wafer 410 so that an interval between a chip 411a disposed at the outermost of the plurality of chips 411 of the first wafer 410 and a chip 421a disposed at the outermost of the plurality of chips 421 of the second wafer 420 adjacent to the first wafer 410 may be a second interval G2.

In the same manner, the third wafer 430 may be arranged spaced apart from the second wafer 420 so that an interval between a chip 421a disposed at the outermost of the plurality of chips 421 of the second wafer 420 and a chip 431a disposed at the outermost of the plurality of chips 431 of the third wafer 430 adjacent to the second wafer 420 may be the second interval G2.

The second interval G2 may be smaller than a fourth interval G4 that will be described below.

The plurality of chips 411, 421, and 431 may be disposed on the wafer, and the plurality of chips 411, 421, and 431 may be disposed at a third interval G3. The third interval G3 may be smaller than the first interval G1. The first interval G1 may be an integral multiple of the third interval G3.

The plurality of chips 411, 421 and 431 may be embodied with Light Emitting Diode (LED) which is a light source of a display. The plurality of chips 411, 421 and 431 may be formed of micro miniature LEDs of 5 to 10 micrometer (μm) size.

The stage 500 may be disposed under the support 100, and formed of a flat or substantially flat substrate.

The plurality of wafers or a printed circuit board 600 (see FIG. 4) on which the picked up chips 412, 422 and 432 are mounted may be disposed on the stage 500.

The printed circuit board 600 could be in various shapes to be applied to display products. The printed circuit board 600 is well known in the art, and thus the detailed description will not be provided here.

Hereinafter, referring to FIG. 1, FIG. 2, FIG. 3, FIG. 4, FIG. 5 and FIG. 6, a chip transfer process through the chip transfer device 1 according to an embodiment of the disclosure will be described in greater detail.

Referring to FIG. 1, a plurality of wafers 410, 420 and 430 may be loaded on the stage 500.

The plurality of pick-up modules 210, 220 and 230 may be disposed to respectively correspond to the plurality of wafers 410, 420 and 430. The plurality of pick-up modules 210, 220 and 230 may be disposed at a fourth interval G4.

The fourth interval G4 may be defined as an interval between the pick-up head 213a arranged at the outermost of the first pick-up module 210 and the pick-up head 223a arranged at the outermost of the second pick-up module 220. In the same manner, the fourth interval G4 may be the same as the interval between the pick-up head 223a disposed at the outermost of the second pick-up module 220 and the pick-up head 223a disposed at the outermost of the third pick-up module 230 adjacent to the second pick-up module 220.

The fourth interval G4 may be greater than the second interval G2 between the chip 411a disposed at the outermost of the plurality of chips 411 of the first wafer 410 and the chip 421a disposed at the outermost of the plurality of chips 421 of the second wafer 420 adjacent to the first wafer 410. Therefore, a single pick-up module may be arranged to correspond to a single wafer, and thus a signal pick-up module may pick up a plurality of chips arranged on a single wafer.

The first pick-up module 210 may pick up the plurality of chips 411 disposed on the first wafer 410, and the second pick-up module 220 may pick up the plurality of chips 421 disposed on the second wafer 420, and the third pick-up module 230 may pick up only the plurality of chips 431 disposed on the third wafer 430.

Figure 2:
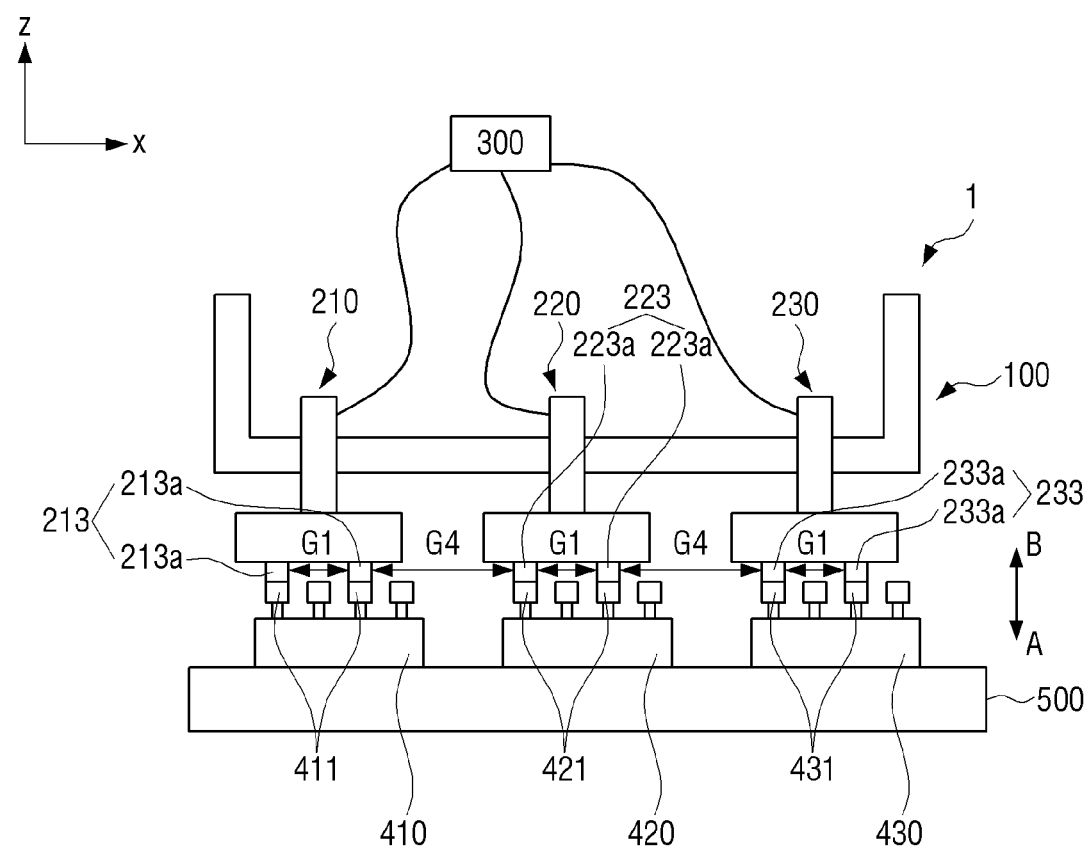
FIG. 2 is a cross-sectional view illustrating an example chip transfer device and an example chip transfer process through a chip transfer device according to an embodiment of the disclosure.
Figure 3:
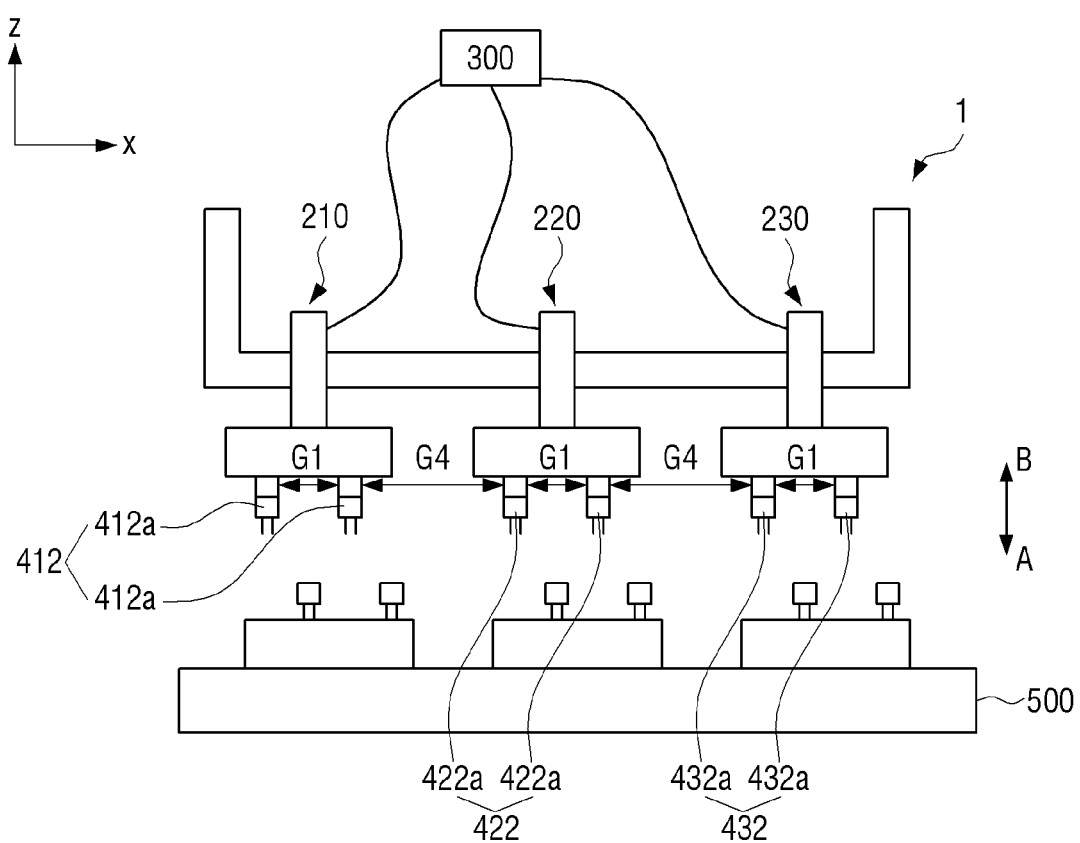
FIG. 3 is a cross-sectional view illustrating an example chip transfer device and an example chip transfer process through a chip transfer device according to an embodiment of the disclosure.

Referring to FIGS. 2 and 3, the support 100 connected to the plurality of pick-up module 210, 220 and 230 may move in a downward direction (direction A), and the plurality of pick-up modules 210, 220 and 230 may collectively pick up the plurality of chips 411, 421, and 431 disposed on the plurality of wafers 410, 420 and 430.

The chip transfer device 1 may collectively pick up the plurality of chips 411, 421 and 431 disposed on the plurality of wafers 410, 420 and 430 disposed at the second interval G2, and thus the transfer speed of the picked up chips 412, 422 and 432 may increase and the transfer efficiency may increase accordingly.

Referring to FIG. 3, the plurality of chips 412 picked up by the first pick-up module 210 may be arranged spaced apart from each other at the first interval G1, which is the interval between the first pick-up heads 213, and the outermost chip 412a picked up by the first pick-up module 210 and the outermost chip 422a picked up by the second pick-up module 220 adjacent to the first pick-up module 210 may be arranged spaced apart from each other at the fourth interval G4.

In the same manner, the plurality of chips 422 picked up by the second pick-up module 220 may be arranged spaced apart from each other at the first interval G1, which is the same as the interval between the second pick-up heads 223, and the outermost chip 422a picked up by the second pick-up module 220 and the outermost chip 432a picked up by the third pick-up module 230 adjacent to the second pick-up module 220 may be arranged spaced apart from each other at the fourth interval G4.

Referring to FIG. 4, while a plurality of chips corresponding to the plurality of wafers 410, 420 and 430 are collectively picked up, each of the plurality of pick-up modules 210, 220 and 230 may move in the horizontal direction (the X-axis direction) so that the plurality of chips 412, 422 and 432 picked up by the controller 300 are arranged spaced apart at the same interval.

The controller 300 may move the plurality of pick-up modules 210, 220 and 230 in a horizontal direction so that the intervals between the plurality of chips 412, 422 and 432 picked up by the plurality of pick-up modules 210, 220 and 230 may be the first interval G1.

The controller 300 may move and control each of the connectors 211 and 222 in a horizontal direction so that the side surface 212c of the first pick-up body 212 may contact to the side surface 222c of the second pick-up module 220 adjacent thereto while the first pick-up module 210 picks up the chip 412.

Referring to FIG. 4, through the movement of the plurality of pick-up modules 210, 220 and 230 in the horizontal direction, the interval between the outermost chip 412c picked up by the first pick-up module 210 and the outermost chip 422c picked up by the second pick-up module 220 which is adjacent to the first pick-up module 210 may be adjusted to be the same as the first interval G1.

In the same manner, the interval between the outermost chip 422c picked up by the second pick-up module 220 and the outermost chip 432c picked up by the third pick-up module 230 adjacent to the second pick-up module 220 may be adjusted to be the same as the first interval G1.

In addition, after the intervals between the plurality of chips 412, 422 and 432 are adjusted to be the same as the first interval G1 through the movement of the plurality of pick-up modules 210, 220 and 230 in the horizontal direction, the plurality of wafers 410, 420 and 430 disposed on the stage 500 may be uploaded, and the printed circuit board 600 may be loaded on the stage 500.

To the extent necessary, the support 100 may move in the horizontal direction (the X-axis direction) toward the top of the printed circuit board 600 at the positions of the wafers 410, 420 and 430.

The chip transfer device 1 may further include a camera (not shown) arranged under the plurality of pick-up modules 210, 220 and 230, and the controller 300 may identify the pattern of the arrangement of the plurality of chips 412, 422 and 432 picked up by the pick-up modules 210, 220 and 230 through the camera, and then identify whether or not the plurality of chips 421, 422 and 432 are defective, for example, the chips are tilted.

A chip determined as being defective may be selectively deleted among the plurality of chips 412, 422 and 432 picked up by the pick-up modules 210, 220 and 230 through an additional process.

Various methods such as, for example, and without limitation, a laser method, an adhesive method, an electrostatic method, a hybrid method and the like can be used as a method of removing a selected defective chip. However, a method of removing a defective chip is a well-known technique in the prior art, and thus will not be further explained here.

Figure 5:
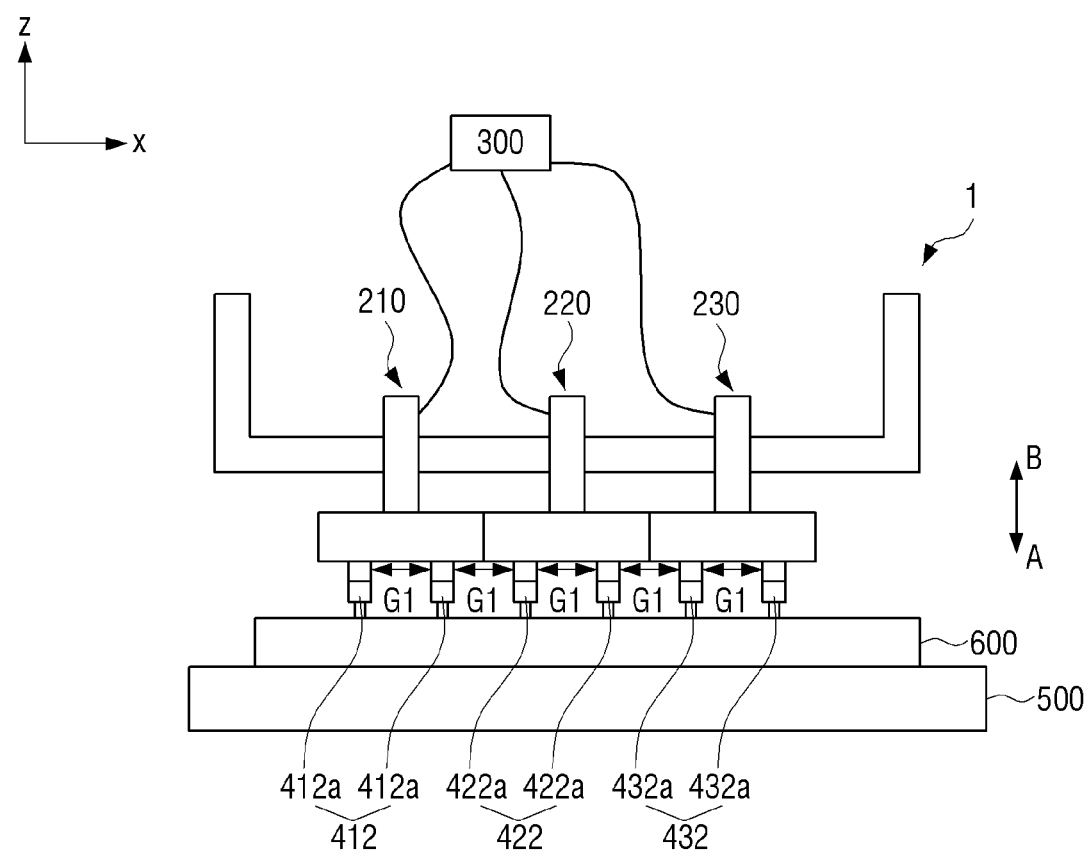
FIG. 5 is a cross-sectional view illustrating an example chip transfer device and an example chip transfer process through a chip transfer device according to an embodiment of the disclosure.
Figure 6:
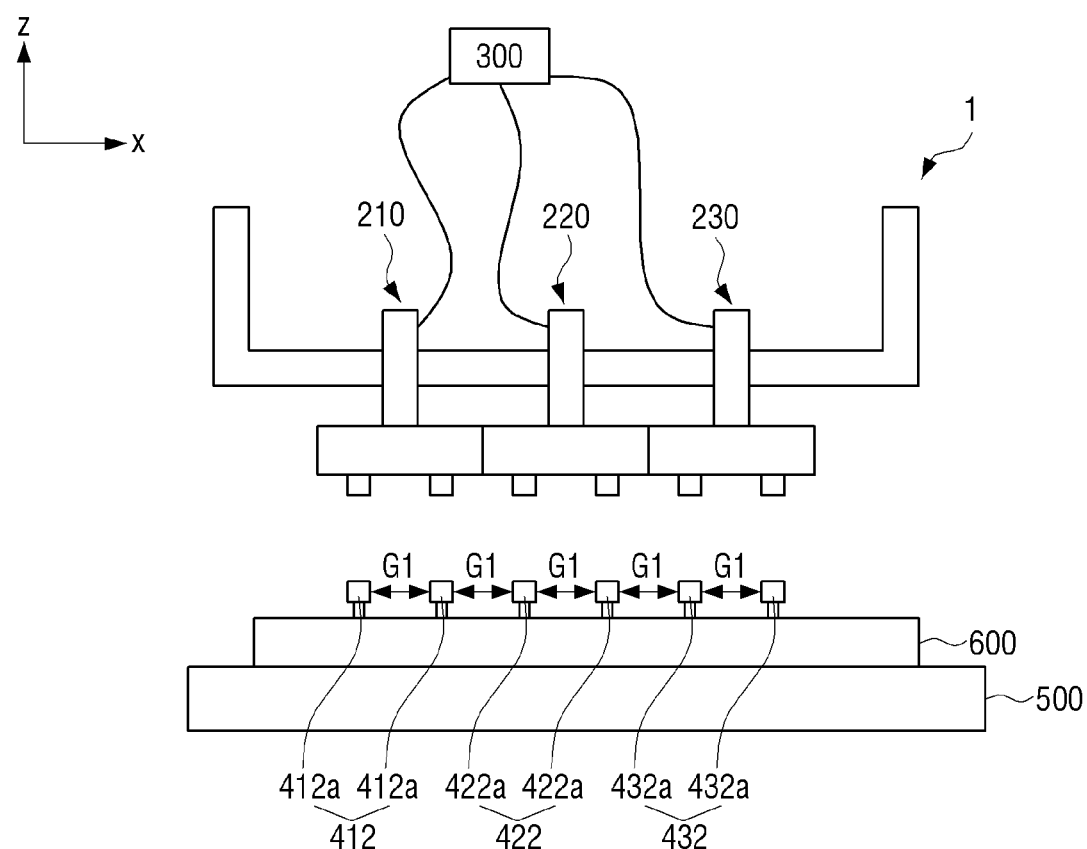
FIG. 6 is a cross-sectional view illustrating an example chip transfer device and an example chip transfer process through a chip transfer device according to an embodiment of the disclosure.

Referring to FIG. 5 and FIG. 6, while the plurality of pick-up modules 210, 220 and 230 pick up the plurality of chips 412, 422 and 432, the plurality of picked up chips 412, 422 and 432 may be mounted on the printed circuit board 600 at the first interval G1 by moving in the downward direction (direction A).

As described above, the chip transfer device 1 may collectively pick up the plurality of chips 412, 422 and 432 of the plurality of wafers 410, 420 and 430 disposed at the second interval G2, and then adjust the intervals between the plurality of chips 412, 422 and 432 to the first interval G1 to mount the plurality of chips 412, 422 and 432 on the printed circuit board 600. Accordingly, the plurality of chips 412, 422 and 432 may be more quickly transferred to and mounted on the printed circuit board 600 from the plurality of wafers 410, 420 and 430.

FIG. 7, FIG. 8, FIG. 9, FIG. 10, FIG. 11, FIG. 12 and FIG. 13 are cross-sectional views illustrating an example chip transfer device 1001 and an example chip transfer process according to another embodiment of the disclosure.

Referring to FIG. 7, FIG. 8, FIG. 9, FIG. 10, FIG. 11, FIG. 12 and FIG. 13, the chip transfer device 1001 according to another embodiment of the disclosure will be described.

Figure 7:
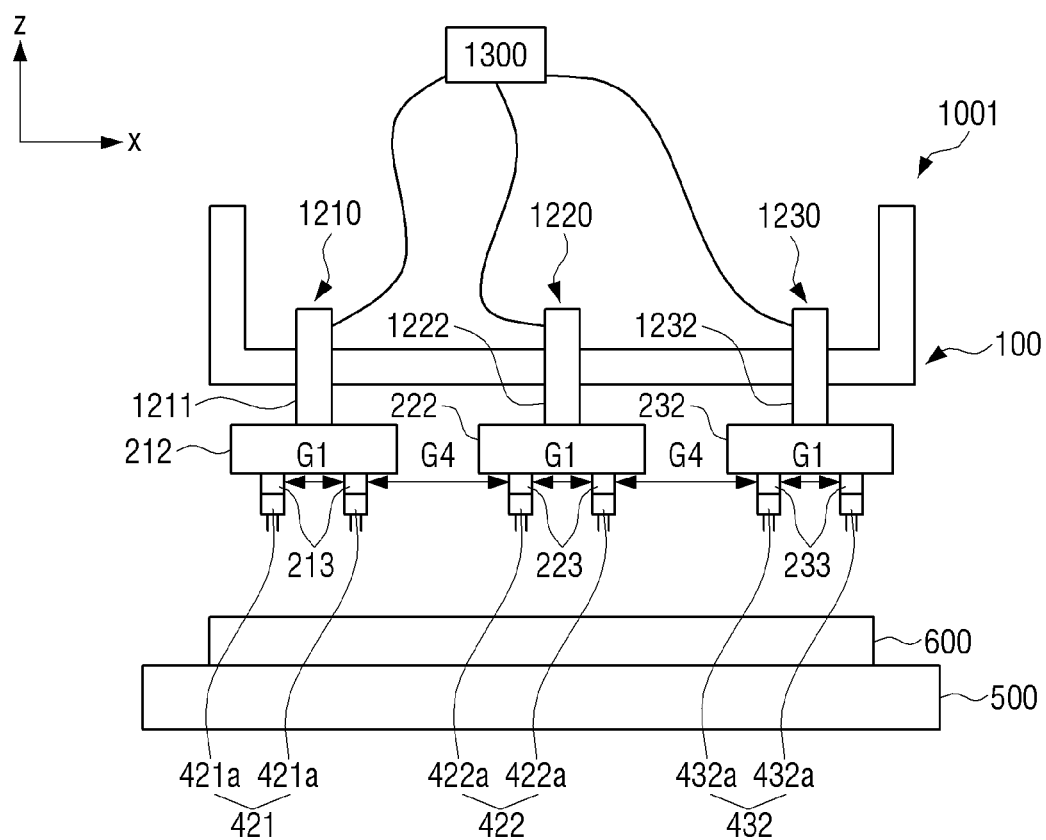
FIG. 7 is a cross-sectional view illustrating an example chip transfer device and an example chip transfer process according to another embodiment of the disclosure.

The support 100, the pick-up body 212, 222, 223, the plurality of pick-up heads 213, 223 and 233, a plurality of chips 411, 421 and 431, the stage 500, and the printed circuit board 600 shown in FIG. 7 are the same as those shown in FIG. 1 and FIG. 4, and thus a repeated description will not be provided here.

Figure 8:
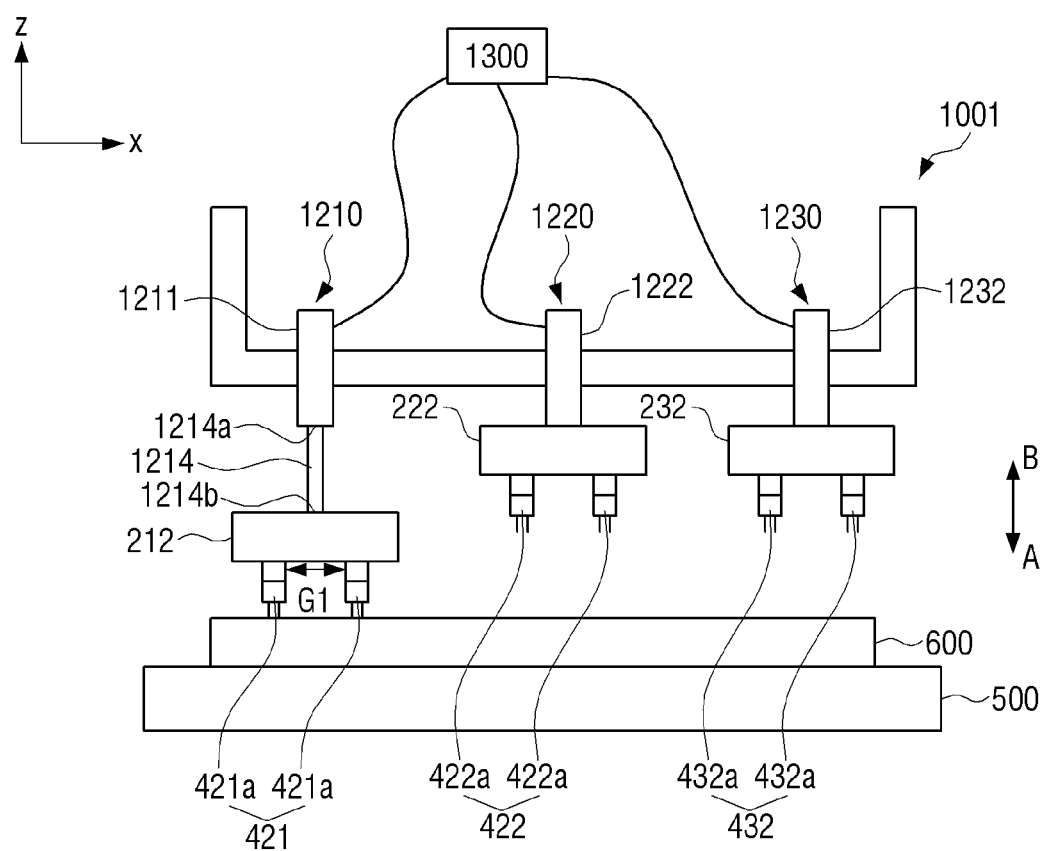
FIG. 8 is a cross-sectional view illustrating an example chip transfer device and an example chip transfer process according to another embodiment of the disclosure.

Referring to FIG. 7 to FIG. 8, the plurality of pickup modules 1210, 1220 and 1230 may include connection parts 1211, 1222 and 1232, the pick-up bodies 212, 222 and 232, and connection extension parts 1214, connecting the connection parts 1211, 1222 and 1232 and the pick-up bodies 212, 222, and 232.

For example, the connection extension parts 1214, 1224, and 1234 may be formed so that one ends 1214*a*, 1224*a*, and 1234*a* may be movably coupled to the connection parts 1211, 1221 and 1231, and the other ends 1214*b*, 1224*b* and 1234*b* may be connected to the pick-up bodies 212, 222, and 232.

For example, the first connection extension part 1214 may include one end 1214*a* movably coupled to the first connection part 1211, the other end 1214*b* connected to the first pickup body 212, and the second connection extension part 1224 may include one end 1224*a* coupled to the second connection part 1221 and the other end 1224*b* connected to the second pickup body 222.

The connection extension parts 1214, 1224, and 1234 may be configured to be movable in a vertical direction (a Z-axis direction) from the connection parts 1211, 1222, and 1232.

For example, the connection extension parts 1214, 1224 and 1234 may be connected to the connection parts 1211, 1222 and 1232 in a piston structure to be movable in the vertical direction (the Z-axis direction) from the connection parts 1211, 1222 and 1232.

The structure of the connection extension parts 1214, 1224 and 1234 may vary as long as the connection extension parts 1214, 1224 and 1234 can move in the vertical direction (the Z-axis direction) with respect to the connection parts 1211, 1221 and 1231.

Accordingly, the pick-up bodies 212, 222 and 232 of the plurality of pickup modules 1210, 1220 and 1230 including the connection extension parts 1214, 1224 and 1234 may move in a vertical direction independently of one another.

The controller 1300 may adjust the connection extension parts 1214, 1224, and 1234 in the vertical direction.

For example, the controller 1300 may sequentially control the plurality of pickup modules 1211, 1222, and 1232 so that the respective connection parts 1211, 1222, and 1232 of the plurality of pickup modules 1211, 1222, and 1232 may move in a horizontal direction while the plurality of pickup modules 1211, 1222 and 1232 pick up the plurality of chips 421, 422 and 432, and then the respective connection extension parts 1214, 1224 and 1234 move in the vertical direction.

Referring to FIG. 7, FIG. 8, FIG. 9, FIG. 10, FIG. 11, FIG. 12 and FIG. 13, a chip transfer process through the chip transfer device 1001 according to another embodiment of the disclosure will be described in greater detail.

FIG. 7 illustrates that the plurality of pick-up modules 1210, 1220 and 1230 are disposed above the printed circuit board 600 loaded on the stage 500 while the plurality of pick-up modules 1210, 1220 and 1230 collectively pick up the plurality of chips 412, 422 and 432 as shown in FIG. 1, FIG. 2 and FIG. 3.

Referring to FIG. 8, by extending the first connection extension part 1214 in the downward direction (direction A) by the controller 1300 with the chip 412 picked up, the chip 412 picked up by the first pick-up head 213 may move in the downward direction (direction A) to be mounted on the printed circuit board 600.

Figure 9:
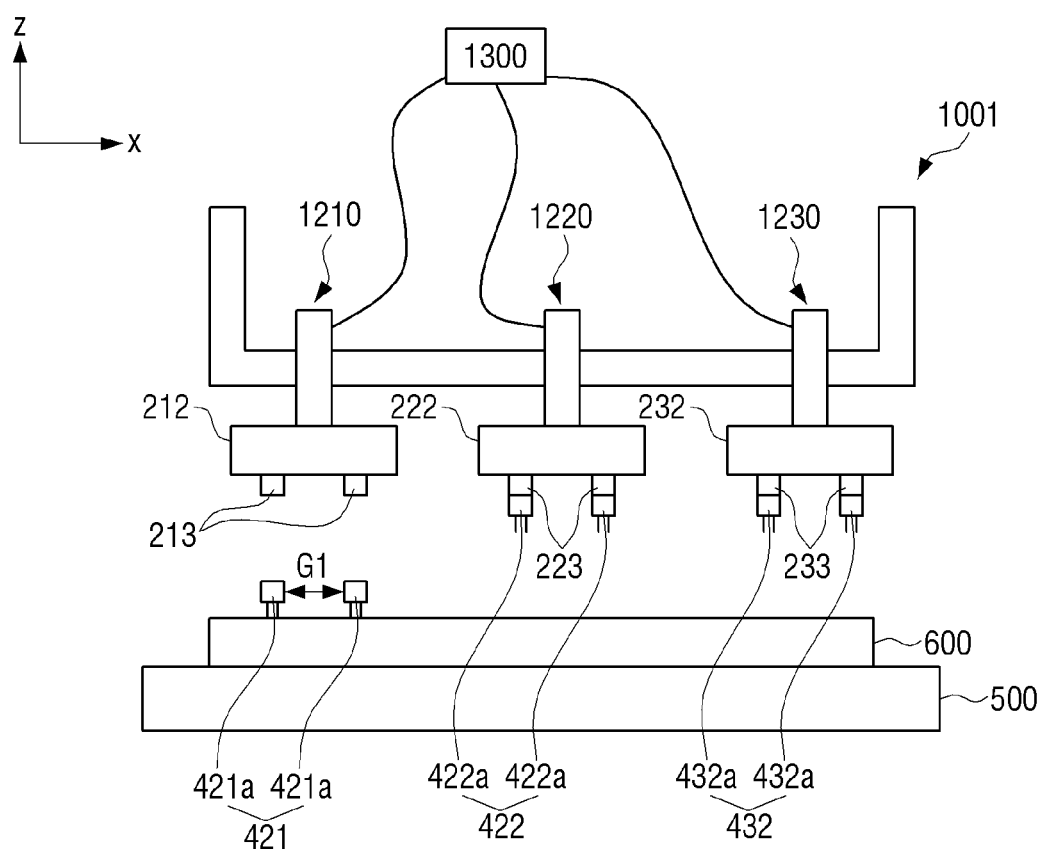
FIG. 9 is a cross-sectional view illustrating an example chip transfer device and an example chip transfer process according to another embodiment of the disclosure.

Referring to FIG. 9, the plurality of chips 421 picked up by the first pick-up head 213 may be mounted on the printed circuit board 600 at the first interval G1, and the first pick-up body 212 may move in an upward direction (direction B).

Figure 10:
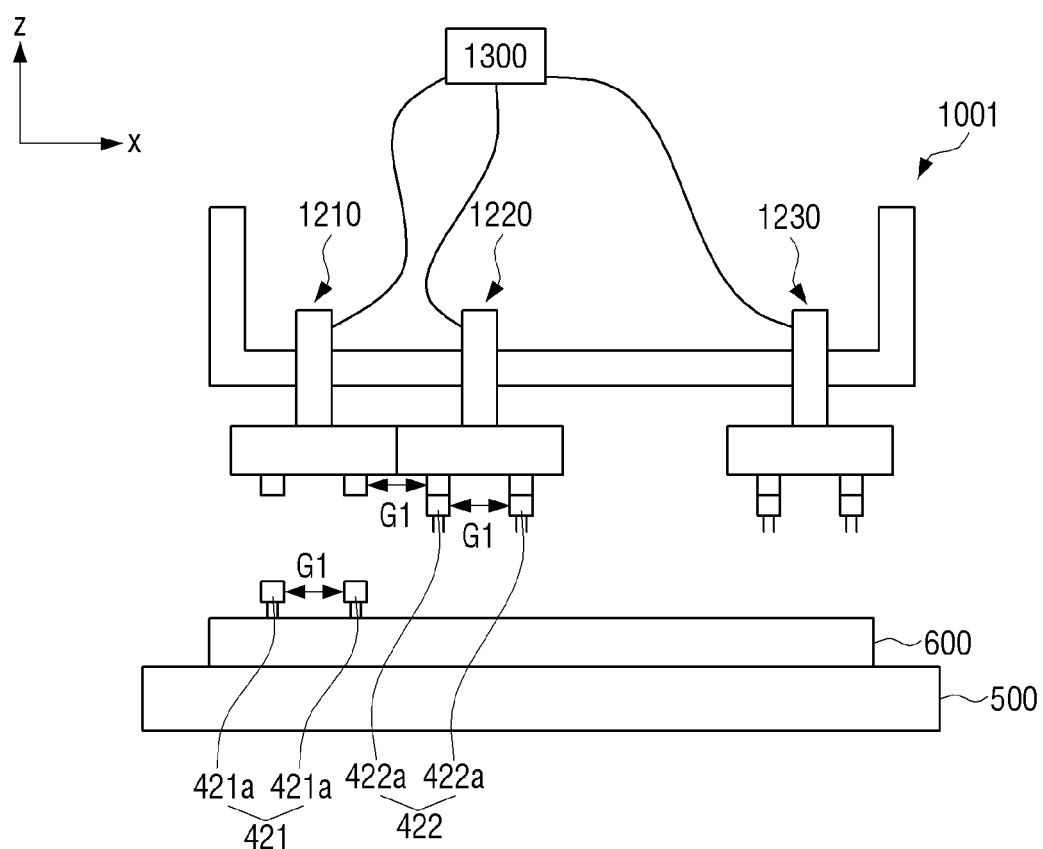
FIG. 10 is a cross-sectional view illustrating an example chip transfer device and an example chip transfer process according to another embodiment of the disclosure.

Referring to FIG. 10, the second pick-up module 1220 adjacent to the first pick-up module 1210 may move in a horizontal direction toward the first pick-up module 1210, and the fourth interval G4 may be adjusted to the first interval G1 accordingly.

To the extent necessary, the plurality of pick-up modules 1210, 1220 and 1230 may move collectively or sequentially in a horizontal direction with the plurality of chips 421, 422 and 432 picked up.

Figure 11:
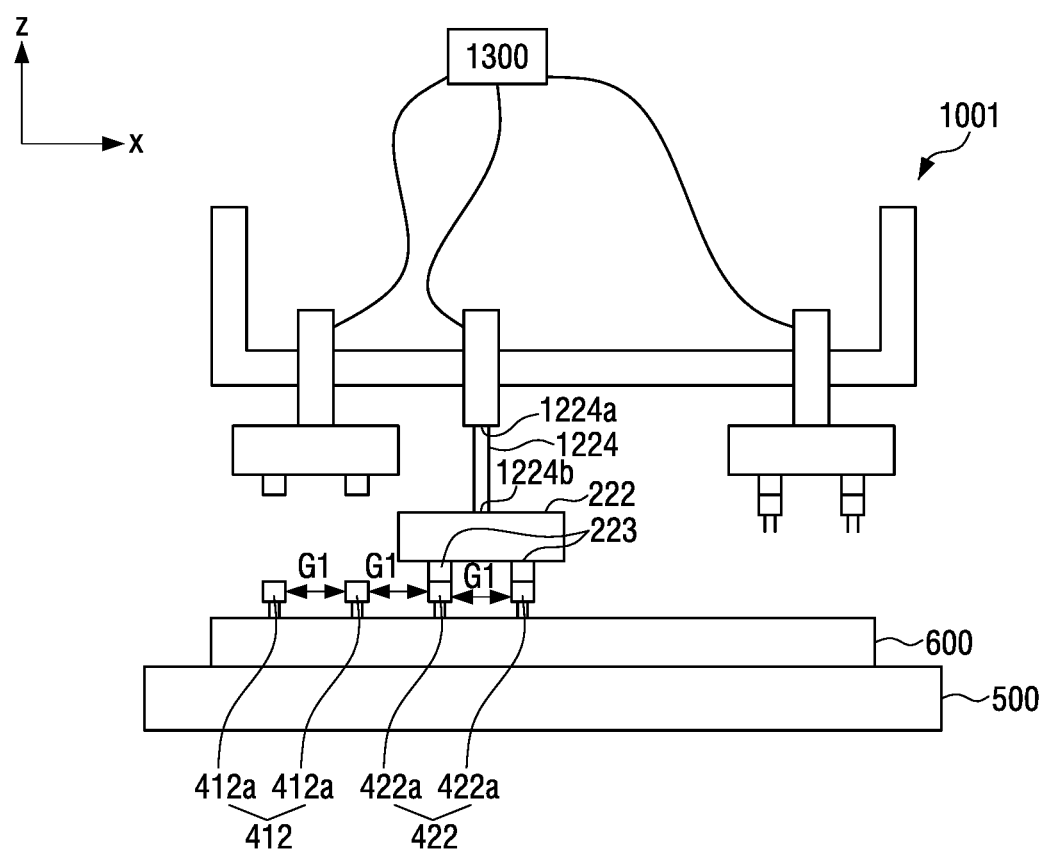
FIG. 11 is a cross-sectional view illustrating an example chip transfer device and an example chip transfer process according to another embodiment of the disclosure.
Figure 12:
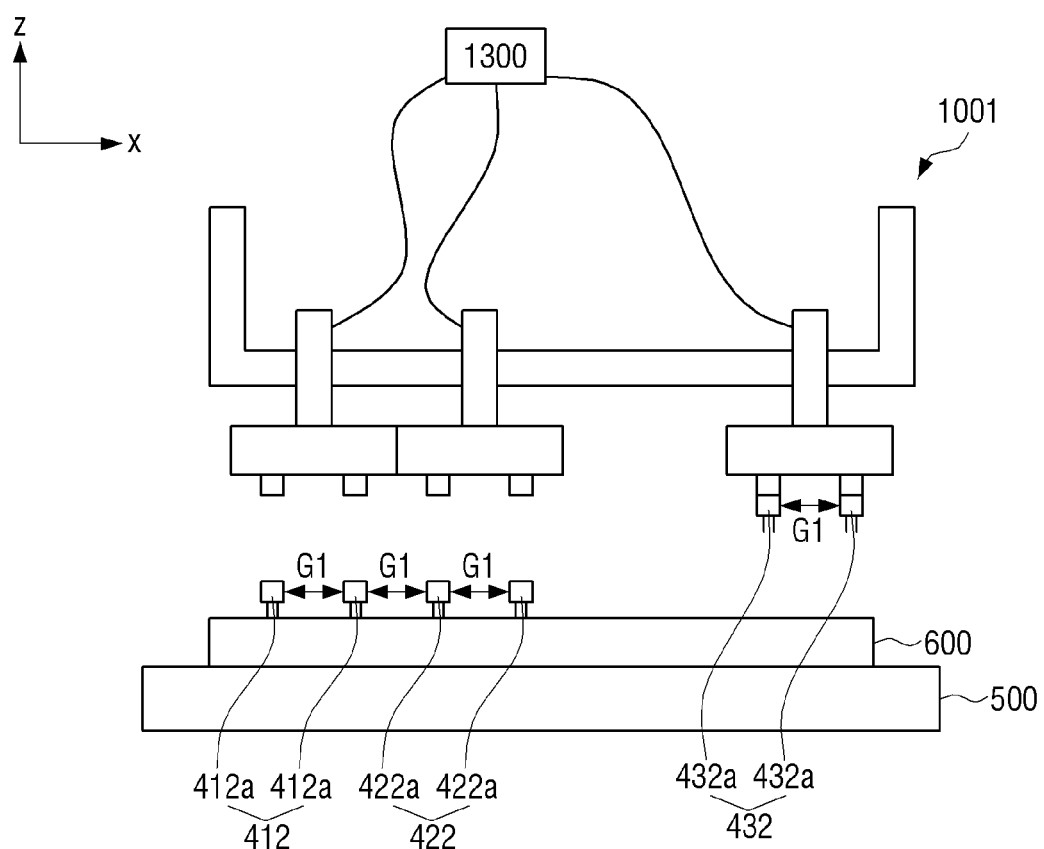
FIG. 12 is a cross-sectional view illustrating an example chip transfer device and an example chip transfer process according to another embodiment of the disclosure.

Referring to FIG. 11 and FIG. 12, when the second pick-up module 1220 that picks up the plurality of chips 422 moves in a horizontal direction, the second connection extension part 1224 may extend in the downward direction (direction A) by the controller 1300, the chip 422 picked up by the second pick-up head 223 may be mounted on the printed circuit board 600 at the first interval G1 together with the chip 421 coupled to the printed circuit board 600 first.

Figure 13:
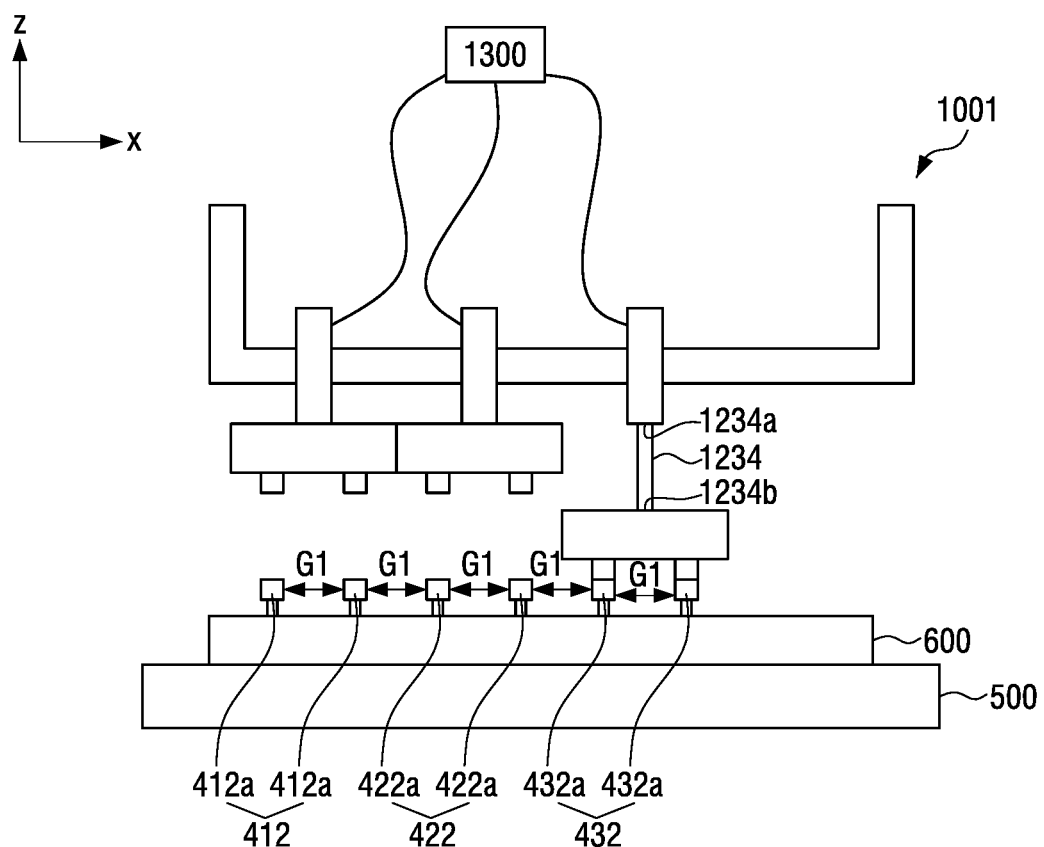
FIG. 13 is a cross-sectional view illustrating an example chip transfer device and an example chip transfer process according to another embodiment of the disclosure.

Referring to FIG. 12 and FIG. 13, the chip 432 picked up by the third pick-up module 1230 may be mounted on the printed circuit board 600 at the first interval G1 together with the chip 422 coupled to the printed circuit board 600 by the second pick-up module 1220.

Therefore, the plurality of chips 412, 422 and 432 mounted on the printed circuit board 600 may be coupled to one another at the first interval G1, and each of the plurality of pick-up modules 1210, 1220 and 1230 may mount the chips 412, 422 and 432 independently picked up on the printed circuit board 600. Therefore, it is possible to transfer chips, and adjust the intervals between the picked up chips 412, 422 and 432 more accurately.

Figure 19:
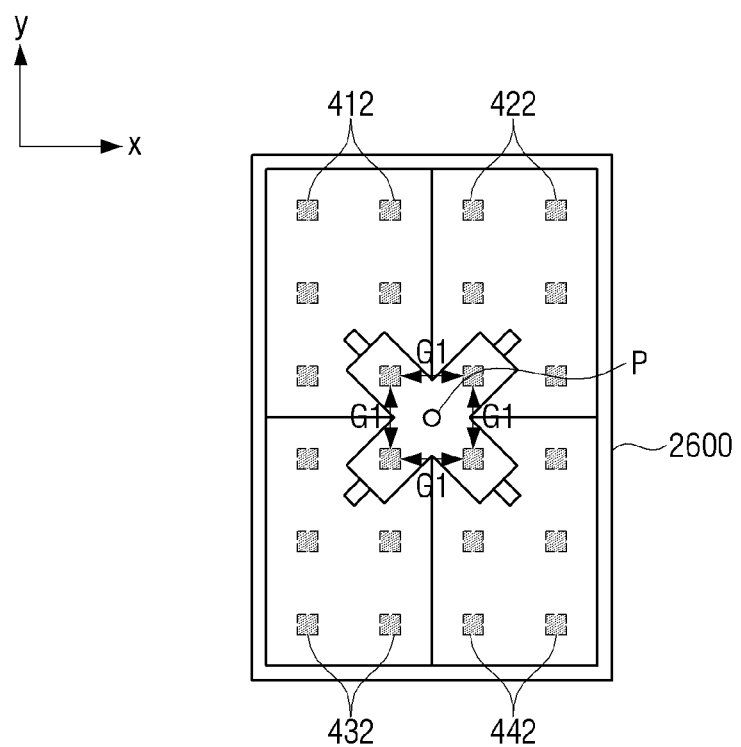
FIG. 19 is a top view illustrating an example chip transfer device and an example chip transfer process according to yet another embodiment of the disclosure.
Figure 20:
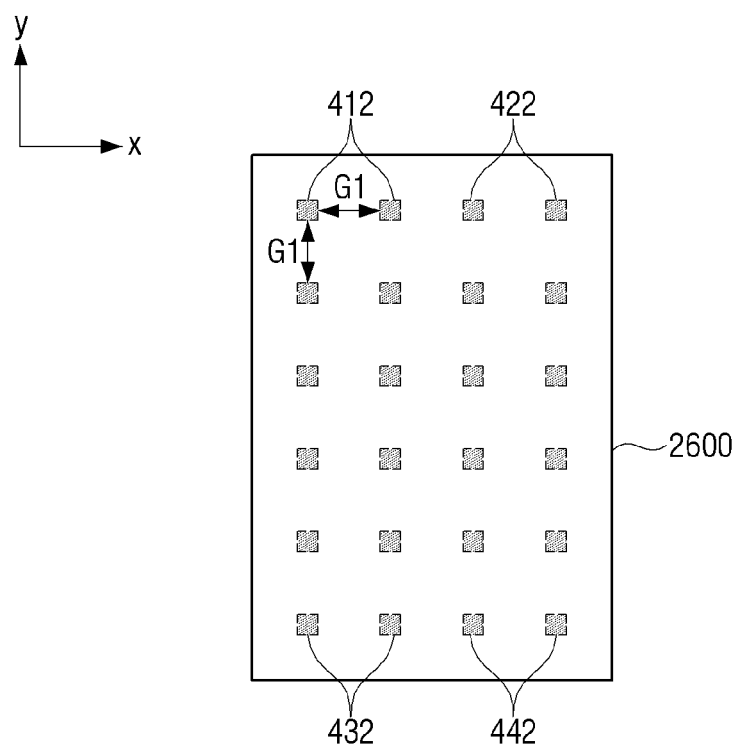
FIG. 20 is a top view illustrating an example chip transfer device and an example chip transfer process according to yet another embodiment of the disclosure.

FIG. 14, FIG. 15, FIG. 16, FIG. 16, FIG. 17, FIG. 18. FIG. 19 and FIG. 20 are top views illustrating an example chip transfer device 2001 and an example chip transfer process through the chip transfer device 2001 according to another embodiment of the disclosure.

Referring to FIG. 14, FIG. 15, FIG. 16, FIG. 17, FIG. 18, FIG. 19 and FIG. 20, the chip transfer device 2001 according to another embodiment of the disclosure will be described.

Figure 14:
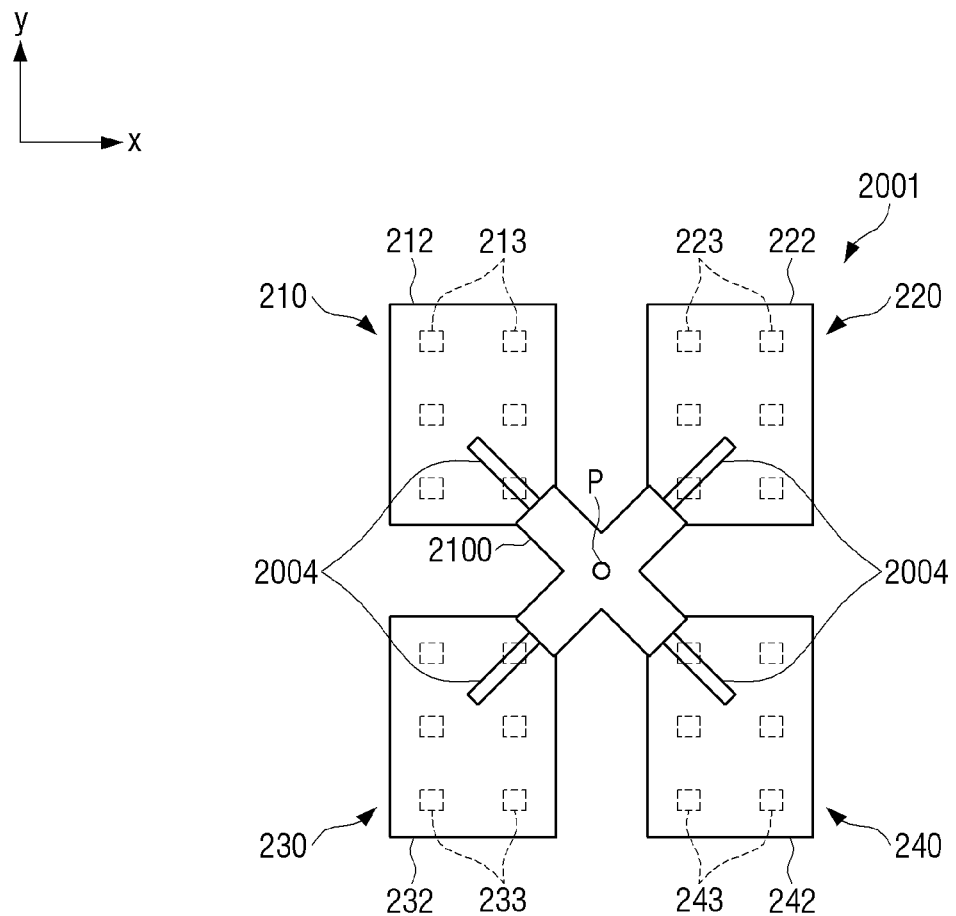
FIG. 14 is a top view illustrating an example chip transfer device and an example chip transfer process according to yet another embodiment of the disclosure.

The plurality of pickup modules 210, 220, 230, the plurality of wafers 410, 420, 430, shown in FIG. 14 are the same as configurations shown in FIG. 1, and thus repeated description will not be provided here.

Figure 15:
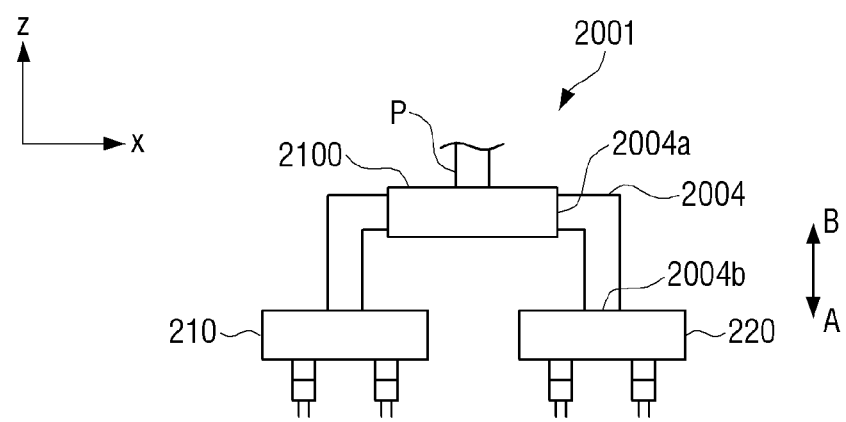
FIG. 15 is a top view illustrating an example chip transfer device and an example chip transfer process according to yet another embodiment of the disclosure.

As shown in FIG. 14 to FIG. 15, the support 2100 may be formed in a cross ("+") shape including protrusions in four directions at an interval of 90 degrees with respect to a center axis P. The center axis P of the support 2100 may be coupled to a structure not shown and the support 2100 may move in horizontal direction (X and Y directions) and in a vertical direction (Z-axis direction) through a well-known structure such as a multi-joint structure, a piston structure, a sliding structure, etc.

The pickup module 200 may include a plurality of the first pickup modules 210, the second pickup modules 220, the third pick-up modules 230, and the fourth pick-up modules 240.

The plurality of pickup modules 210, 220, 230, and 240 may be arranged in a grid to respectively correspond to the plurality of wafers 410, 420, 430, and 440 arranged in a grid pattern.

One end 2004a of the connection extension part 2004 may be movably coupled to the support 2100 and the other end 2004b may be connected to the pick-up bodies 212, 222, 232 and 242, and the connection extension part 2004 may include one vertical bending portion for connecting the support 2100 and the pick-up bodies 212, 222, 232 and 242.

Hereinafter, the chip transfer process through the chip transfer device 2001 according to another embodiment of the disclosure will be described in greater detail with reference to FIG. 16, FIG. 17, FIG. 18, FIG. 19 and FIG. 20.

Figure 16:
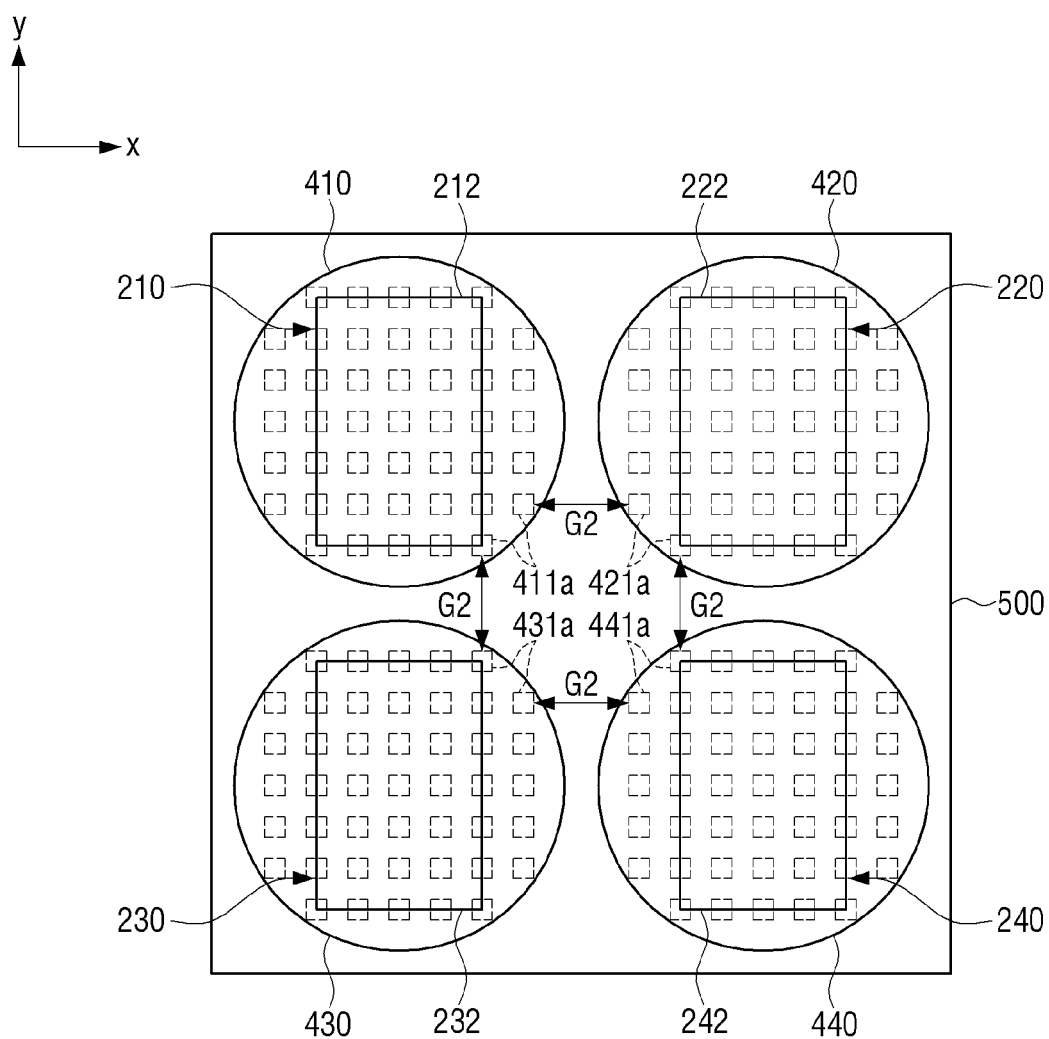
FIG. 16 is a top view illustrating an example chip transfer device and an example chip transfer process according to yet another embodiment of the disclosure.

Referring to FIG. 16, a plurality of pickup modules 210, 220, 230, and 240 may be disposed to correspond to the plurality of wafers 410, 420, 430 and 440 arranged in a grid pattern on the first stage 500 at the second interval G2.

The support 2100 may move in the downward direction (direction A, see FIG. 15) where the plurality of wafers 410, 420, 430, and 440 are located, and the plurality of pickup modules 210, 220, 230, 240 may collectively pick up the plurality of chips 411, 421, 431, 441.

Figure 17:
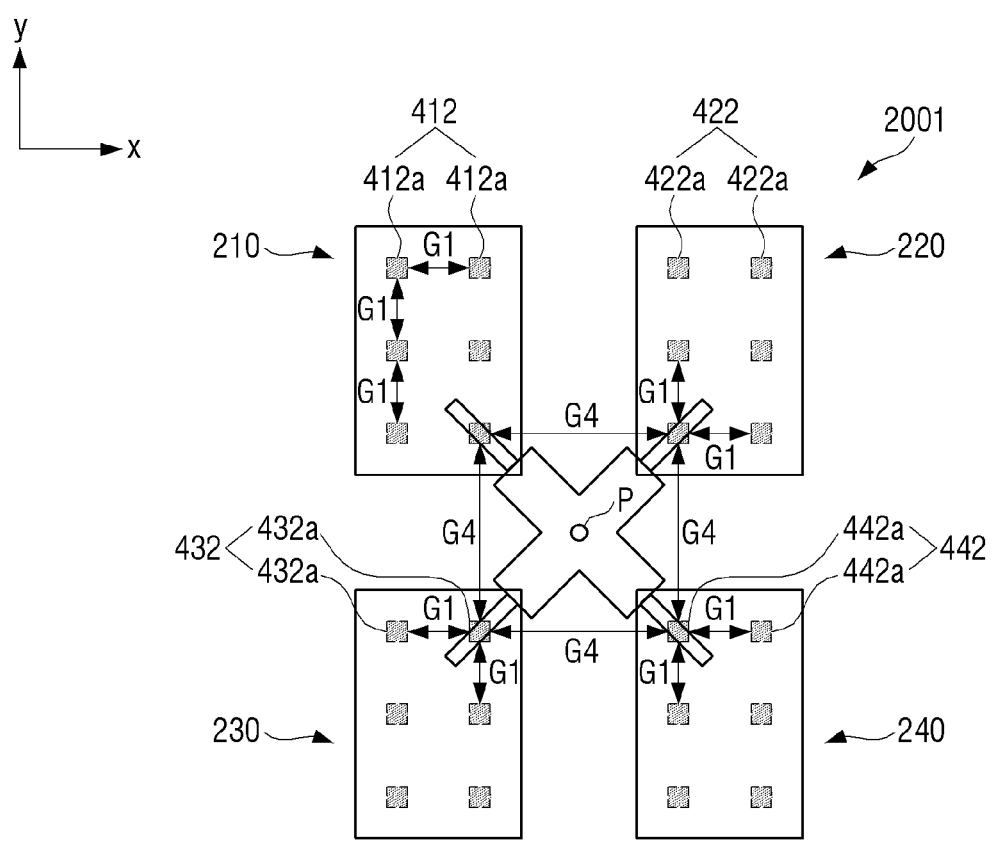
FIG. 17 is a top view illustrating an example chip transfer device and an example chip transfer process according to yet another embodiment of the disclosure.

Referring to FIG. 17, the interval between the chips 412 picked up by the first pick-up module 210 may be the first interval G1, which is the interval between the first pick-up heads 213, and the interval between the outermost chip 412a picked up by the first pick-up module 210 and the outermost chips 422a picked up by the second pick-up module 220 adjacent to the first pick-up module 210 may be the fourth gap G4. The interval between the outermost chip 412a picked up by the first pick-up module 210 and the outermost chips 432a picked up by the third pick-up module 230 adjacent to the first pick-up module 210 may be the fourth gap G4.

Figure 18:
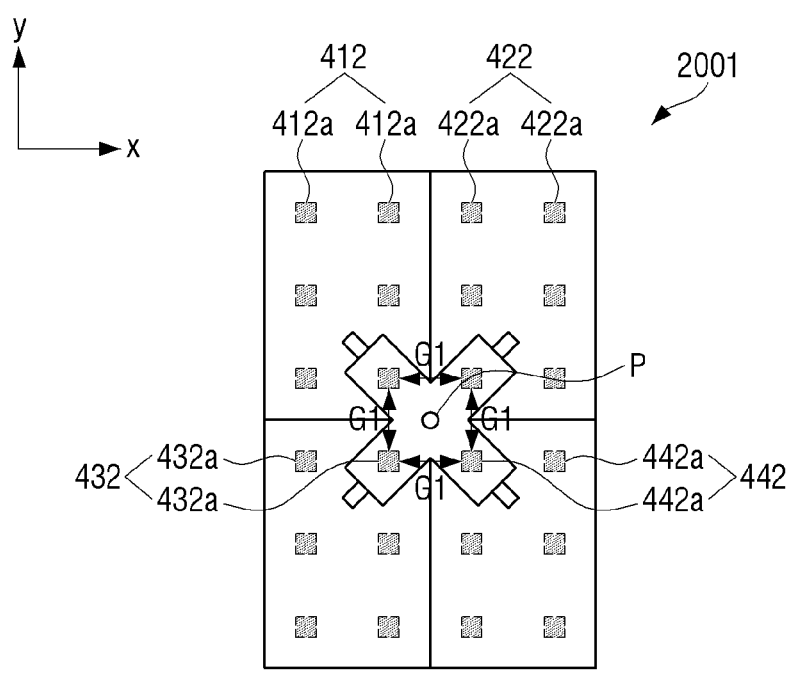
FIG. 18 is a top view illustrating an example chip transfer device and an example chip transfer process according to yet another embodiment of the disclosure.

Referring to FIG. 18, while the plurality of chips 412, 422, 432, 442 are picked up, the connection extension part 2004 may move in a P-axis direction base on the P-axis, and the intervals between the picked-up chips 412, 422, 432, 442 may be the first gap G1.

Thereafter, referring to FIG. 19, while the interval between the plurality of chips 412, 422, 432 and 442 is the first gap G1, the plurality of wafers 410, 420, 430 and 440 may be unloaded, and the printed circuit board 2600 may be loaded on the bottom of the chip transfer device 2001.

Referring to FIG. 20, while the plurality of chips 412, 422, 432, 442 are picked up, the support 2100 may move in the downward direction where the printed circuit board 2600 is located, and the plurality of chips 412, 422, 432, and 442 picked up on the printed circuit board 2600 may be mounted at the first gap G1.

The chip transfer device 2001 may mount the plurality of picked-up chips 412, 422, 432 and 442 on the printed circuit board 2600 in various shapes at the first gap G1 with maintaining a quick transfer speed by using the plurality of pick-up modules 210, 220, 230 and 240 arranged in a grid pattern.

Figure 21:
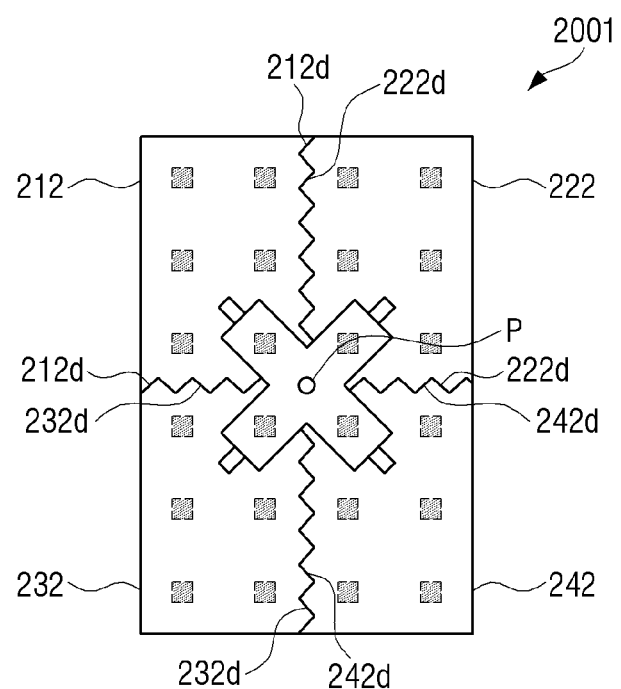
FIG. 21 is a top view illustrating an example chip transfer device according to a modified example embodiment of the disclosure.

FIG. 21 is a top view illustrating a chip transfer device 2001 according to a modified example embodiment of the disclosure.

Referring to FIG. 21, the modified example embodiment of the chip transfer device 2001 of the disclosure will be described in greater detail.

The side surfaces 212c, 222c, 232c and 242c of the respective pickup bodies 212, 222, 232 and 242 may include tooth portions 212d, 222d, 232d and 242d formed to be engaged with the side surfaces 212c, 222c, 232c and 242c of the adjacent pickup bodies 212, 222, 232 and 242.

For example, the side surface 212c of the first pick-up body 212 may include the tooth portion 212d formed to be engaged with the side surfaces 222c and 232c of the adjacent second and third pick-up bodies 222 and 232.

Similarly, the side surface 242c of the fourth pick-up body 242 may include the tooth portion 242d formed to be engaged with the side surfaces 222c and 232c of the adjacent second and third pick-up bodies 222 and 232.

The plurality of pickup bodies 212, 222, 232 and 242 may contact the tooth portions 212d, 222d, 232d and 242d formed on the respective side surfaces 212c, 222c, 232c and 242c in order to maintain the first gap G1 between the picked up chips 412, 422, 432, and 442.

Accordingly, the control error of the first gap G1 generated in the movement process of the plurality of pickup bodies 212, 222, 232 and 242 may be fixed, and uneven first gap G1 is not maintained due to the manufacturing tolerance of the plurality of pickup bodies 212, 222, 232 and 242 may be adjust through the contact between the tooth portions 212d, 222d, 232d and 242d formed on the side surfaces 212c, 222c, 232c and 242c.

While the disclosure has been illustrated and described with reference to various example embodiments thereof, it is to be understood that the disclosure is not limited to the example embodiments. The configuration and operation of each embodiment may be implemented in combination with at least one other embodiment.

Although example embodiments have been shown and described, it will be appreciated by those skilled in the art that changes may be made to these example embodiments without departing from the principles and spirit of the disclosure. Accordingly, the scope of the disclosure is not to be understood as being limited to the various example embodiments, but is defined, for example, by the appended claims as well as equivalents thereto.

What is claimed is:

1. A chip transfer device, comprising:
a support;
a plurality of pick-up modules disposed on the support in a horizontal direction, and movably connected to the support; and
a controller configured to control the plurality of pick-up modules,
wherein each of the plurality of pick-up modules is configured to collectively pick up a plurality of chips arranged in the horizontal direction on a corresponding wafer among a plurality of wafers and to be movable the plurality of chips are collectively picked up by the plurality of pick-up modules, and
wherein the controller is configured to move and adjust the plurality of pick-up modules in the horizontal direction to change intervals between the plurality of chips picked up by each pick-up module,
wherein the controller is configured to adjust the plurality of pick-up modules in the horizontal direction to provide the plurality of pick-up modules at a first interval in the horizontal direction when the plurality of pickup modules are controlled to pick up the plurality of chips, and to adjust the plurality of pick-up modules in the horizontal direction to provide the plurality of pick-up modules at a second interval in the horizontal direction after the plurality of chips are picked up by the plurality of pick-up modules, wherein the second interval is smaller than the first interval.

2. The device as claimed in claim 1, wherein each of the plurality of pick-up modules comprises:
a connection part movably connected to the support in a horizontal direction;
a pick-up body connected to one end of the connection part; and
a plurality of pick-up heads arranged spaced apart from one another on the pickup body at a first interval.

3. The device as claimed in claim 2, wherein a length between an outermost pick-up head, among the plurality of pick-up heads arranged on a pick-up body, and a side surface of the pick-up body is half of the first interval.

4. The device as claimed in claim 3, wherein the controller is configured to move and adjust each connection part in a horizontal direction to render the side surface of the pick-up body to contact a side surface of an adjacent pick-up body while the plurality of pick-up modules pick up the plurality of chips.

5. The device as claimed in claim 4, wherein the side surface of the pick-up body comprises a tooth-shaped portion configured to engage the side surface of the adjacent pick-up body.

6. The device as claimed in claim 2, wherein the controller is configured to move and adjust the connection part in a horizontal direction to provide predetermined intervals of the plurality of chips picked up by the pick-up module at the first interval.

7. The device as claimed in claim 2, wherein each of the plurality of pick-up modules further comprises a connection extension part connecting the connection part and the pick-up body, and
wherein the connection extension part is configured to be movable in a vertical direction from the connection part.

8. The device as claimed in claim 7, wherein the controller is configured to collectively move and adjust the connection extension part in a vertical direction.

9. The device as claimed in claim 7, wherein the controller is configured to sequentially control the plurality of pick-up modules while the plurality of pick-up modules pick up the plurality of chips, to control respective connection parts of the plurality of pick-up modules to move in a horizontal direction, and to control each connection extension part to move in a vertical direction.

10. The device as claimed in claim 2, further comprising:
a stage configured to support the plurality of wafers or a printed circuit board on which the plurality of picked up chips are mounted.

11. The device as claimed in claim 1, wherein the plurality of wafers are disposed in a grid pattern, and
wherein the plurality of pick-up modules are arranged in a grid pattern respectively corresponding to the plurality of wafers.

12. The device as claimed in claim 1, wherein the plurality of pick-up modules are configured pick up the plurality of chips simultaneously.

13. The device as claimed in claim 1, wherein each of the pick-up modules comprises at least one pick-up head.

14. The device as claimed in claim 1, wherein each of the pick-up modules comprises a plurality of pick-up heads.

* * * * *